United States Patent [19]

Gravisse et al.

[11] 3,912,931

[45] Oct. 14, 1975

[54] PHOTOVOLTAIC DEVICE WITH LUMINESCENT LAYERS OF DIFFERING COMPOSITION

[76] Inventors: Philippe Edouard Leon Alexis Gravisse, 9, Residence Boieldieu, 92800-Puteaux; Michel Prevot, 20, Rue Chartran, 92300-Neuilly, both of France

[22] Filed: June 14, 1974

[21] Appl. No.: 479,516

[30] Foreign Application Priority Data

June 15, 1973 France .............................. 73.21890

[52] U.S. Cl. ............. 250/458; 250/211 R; 250/372; 250/461

[51] Int. Cl.² ............................................ F21K 2/02

[58] Field of Search ........... 250/372, 361, 363, 365, 250/367, 213 R, 213 VT, 211 R, 458, 461; 252/301.2 R

[56] References Cited

UNITED STATES PATENTS 3,838,282 9/1974 Harris ................................ 250/372

*Primary Examiner*—Davis L. Willis

*Attorney, Agent, or Firm*—Staas & Halsey

[57] ABSTRACT

Photovoltaic device comprising a conventional photovoltaic cell and a series of thin layers successively applied on the photocell surface, said layers being of different compositions and selected in such a manner that the light energy in a spectrum zone, falling on the outermost layer, may be transferred successively in cascade, through the intermediary of the various layers, up to the spectral sensitivity zone of the photovoltaic cell.

10 Claims, 4 Drawing Figures

PHOTOVOLTAIC DEVICE WITH LUMINESCENT LAYERS OF DIFFERING COMPOSITION

The invention relates to photovoltaic devices such as photovoltaic cells, solar battery elements and the like.

The invention is based on the fact that the usual photovoltaic cells, consisting of a silicium doped junction diode, have a sensitivity curve which is limited in a spectrum zone of great wavelengths. Then it would be advantageous to make use of other spectrum regions endowed with greater energy (violet, near ultraviolet, remote ultraviolet).

In order to effect this transfer of sensitivity which would then correspond to an actual increase of the captivated energy —that is to say, to a greater current delivered by the photovoltaic cell, with the same conversion efficiency— it was imagined, according to the invention, to coat the large surface (provided for receiving radiation) of the usual photovoltaic cell with at least one layer of a luminescent substance which is so chosen that its response to spectral excitation is, on an average, lower in the scale of the wavelengths than the spectral sensitivity zone of the photovoltaic cell alone.

Preferably the photovoltaic device according to the invention comprises a series of thin luminescent layers of different compositions, which are laid over the surface of the photovoltaic cell, the order of succession and the composition of these layers being selected in such manner that the light energy, in a spectrum zone, falling upon the outermost thin layer is transferred in cascade, through the intermediary of the interposed individual layers, to the spectral sensitivity zone of the photovoltaic cell itself.

Preferably also the thin layers will be selected with a sufficient transparency for the usual spectral zone of the photovoltaic cell so that radiation in this zone may reach this cell, with the consequence that the electric output current will be further increased.

A large family of luminescent organic substances of the aromatic kind are known, which may be drawn up according to the increasing number of benzenic nuclei they contain: benzene, naphtalene, anthracene, naphtacene, pentacene . . . Each of their ring molecules is excited by the photons in the wavelength bands just below a certain value of a limiting wavelength and each issues photons in wavelength bands just above the same value. In this family said limiting values are approximately:

for the benzene: 2700 A
for the naphtalene: 3100 A
for the anthracene: 3800 A
for the naphtacene: 4700 A
for the pentacene: 6200 A This cascade luminescence has been used in a number of radar screens in order to increase the remanence thereof.

But the invention puts two potential facts together, which were not associated until now, i.e. the luminescence cascade properties of such a family of organic substances on the one hand and the spectral sensitivity curve of a photovoltaic cell on the other, with the aim of constructing a photovoltaic device which is capable of delivering a greater current than those already known, for a same surface exposed. It happens that it is actually feasible to associate the two said potential facts for deriving therefrom the sensitivity transfer as above defined. The necessary details will now be given for reducing the principle of the invention to practice.

To this end one will refer to the drawing wherein.

As it is understood from the foregoing, superimposed thin layers are laid over the surface of a silicium photovoltaic cell, said layers being selected with spectral characteristic responses which complement each other and the spectral response of silicium.

The cascade of spectral responses permits of displacing (and increasing) the sensitivity of the photovoltaic device thus arranged from the band restricted in 7000 – 8000 A into the band 3000 – 8000 A. Consequently instead of a potential photonic energy of 1 KVA per square meter a potential photonic energy of 2.7 – 3 KVA per square meter is available and may be converted into a current.

As already said, with respect to conventional photovoltaic cells the energy conversion efficiency (about 13%) of the new photovoltaic device will be unchanged or not much altered; but the captivated energy —which is a direct function of incident energy— will be very much increased (practically in a 1 : 7 ratio).

One may use any known means for laying down on the surface basis of the silicium photovoltaic cell (of a known type which is not changed) a suitable number of selected layers comprising aromatic nuclei such as benzene, naphtalene, anthracene, pentacene, or their cyclic derivatives, for obtaining the successive cascade amplifying elements. It is advantageous to fix these aromatic substances with a silicone resin so as to avoid their evaporation or degradation. This means that every layer will be applied in the form of silicone resin impregnated with the corresponding aromatic element.

Figure 1:
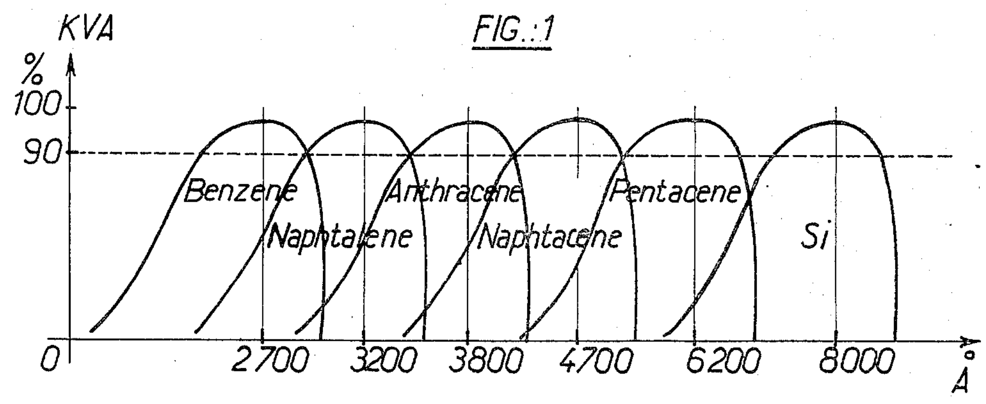
FIG. 1 shows a group of response curves, for aromatic substances usable for the invention.

The whole system of characteristic response curves cooperates with the sensitivity curve of the Si-photovoltaic cell as shown in FIG. 1.

Thus, it is possible to use this series of layers of luminescent, photoconducting substances in cascade and in such manner that photons issued by a layer of substance A may be used for exciting another layer of substance B having a higher characteristic wavelength and so on. For instance, emission from the benzene may excite cyclic nuclei of naphtalene; emission of the latter, corresponding to a wavelength of 3200 A may excite in its turn cyclic nuclei of anthracene, which corresponds to a wavelength of 3800 A; and so forth up to the usable wavelength of the basis material, for instance silicium, in the case of photovoltaic cells DP X 46 (manufactured by La Radiotechnique RTC). It may be remarked that the luminescence wavelength (and also, consequently, the energy captivated) increases progressively with the molecule length, in the same manner as in radio transmission the optimal length of an antenna increases with the wavelength to be received or transmitted. On the whole, potential energy which may be converted into a current is multiplied by a factor which depends on the number of layers used.

Figure 2:
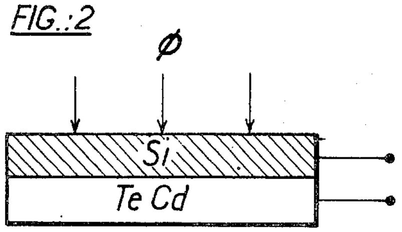
FIGS. 2 and 3 show schematically and comparatively the configuration of a conventional photovoltaic and a photovoltaic device according to the invention.

In FIG. 2 is schematically represented a conventional solar battery element, which comprises a silicium layer applied on a layer of cadmium telluride so as to form a potential barrier. This cell may be of the above named type DPX 46.

Figure 3:
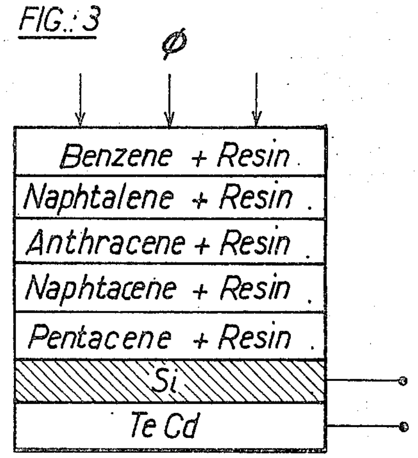

In FIG. 3 the same cell is used as a basis for applying successively the above-mentioned series of layers, for instance through vaporization under vacuum.

If a photon flux $\phi$ strikes the device of FIG. 3, a part of this flux reaches directly the photovoltaic cell basis without any transformation and is converted into current; another part is reflected and sent back outwardly (which may be avoided, at least partly, by applying over the first or benzene layer a supplemental layer known in itself as anti-reflecting layer); and still another part, by far the most important, undergoes the successive interactions with the different layers.

Figure 4:
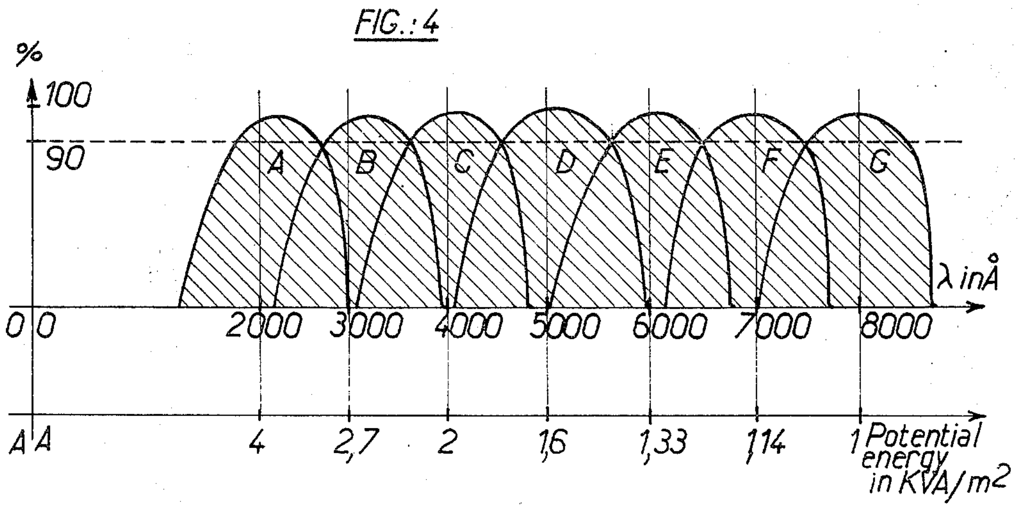
FIG. 4 illustrates how to calculate theoretically the energetic output of a device according to the invention.

By using the graphs of FIG. 4 it is possible to calculate the energetic output of the cascade amplification (with round wavelengths for the sake of simplification).

On a wavelength of 8000 A, a potential energy of 1 KVA per sq.m. is available.

According to the equation $W = h\nu$, an energy of 4 KVA/m2 is available on 2000 A (for $W_1/W_2 = h\nu_1/h\nu_2 = \lambda_2/\lambda_1$).

On the AX axis the potential energies corresponding in principle to the wavelengths are marked.

The following equation will be repeatedly used:

$E_d = (E_{d-1}\ a) - E_l + E_c$ with $E_d$ = energy available in a given layer;

$E_{d-1}$ = energy available in the preceding layer;

$a$ = transmission coefficient (practically 0.9)

$E_1$ = liberation energy $E_c$ = potential energy (in KVA per sq. m.) of the spectrum zone which corresponds to the layer.

Then successively:

In A : $E_p = 4$ KVA/m2 = A with $E_1 = 1/10\ (A \times a)$

In B : $E_p = (4 \times 0.9) - 0.36 + 2.7 = 5.9$ KVA/m2

In C : $E_p = (5.9 \times 0.9) - 0.5 + 2 = 6.8$ KVA/m2

In D : $E_p = (6.8 \times 0.9) - 0.6 + 1.6 = 7.1$ KVA/m2

In E : $E_p = (7.1 \times 0.9) - 0.64 + 1.33 = 7.1$ KVA/m2

In F : $E_p = (7.1 \times 0.9) - 0.64 + 1.14 = 6.9$ KVA/m2

In G : $E_p = (6.9 \times 0.9) - 0.6 + 1 = 6.6$ KVA/m2.

Thus it is seen that theoretically a potential energy of the order of 7 times the initial energy, for producing an electric current, will be available. The spectral, characteristic response curve will be the envelope of the curves A, B, C, D, E, F, G.

For obtaining an approximation the different quantum efficiencies corresponding to the various wavelengths were not taken into account, although they have some influence.

It is not absolutely necessary that the device of the invention comprises all the five thin layers of the family as above mentioned. Besides, instead of the substances named it is possible to substitute cyclic derivatives of the same substances that present similar luminescence properties, for instance the series of the complementary rare-earth elements, with a suitable photovoltaic cell as a basis.

It is clear that these photovoltaic devices may be used in a wide variety of industrial applications (car batteries, modules, aeronautic, spatial and naval apparatus, lighting and beacon units, etc . . . ).

We claim:

1. A photovoltaic device, comprising a photovoltaic cell of the junction diode type with a large surface for receiving radiation and at least one thin layer of a luminescent substance of the aromatic family coating said surface, said substance being so chosen that the response to spectral excitation of said substance is, on an average, situated lower, on the scale of the wavelengths, than the zone of spectral sensitivity of the photovoltaic cell alone.

2. A photovoltaic device as claimed in claim 1, wherein said photovoltaic cell is of the doped silicium type and wherein the layer directly applied on the photovoltaic cell is made of silicone resin impregnated with pentacene.

3. A photovoltaic device as claimed in claim 2, wherein a second thin layer is applied on the first layer directly applied on the photovoltaic cell, this second layer being made of silicone resin impregnated with naphtacene.

4. A photovoltaic device as claimed in claim 3, wherein a third thin layer is applied on the second layer, this third layer being made of silicone resin impregnated with anthracene.

5. A photovoltaic device as claimed in claim 4, wherein a fourth thin layer is applied on the third layer, this fourth layer being made of silicone resin impregnated with naphtalene.

6. A photovoltaic device as claimed in claim 5, wherein a fifth thin layer is applied on the fourth layer, this fifth layer being made of silicone resin impregnated with benzene.

7. A photovoltaic device, comprising a photovoltaic cell of the junction diode type with a large surface for receiving radiation and at least one thin layer of a luminescent substance coating said surface, said substance being so chosen that the response to spectral excitation of said substance is, on an average, situated lower, on the scale of the wavelengths, than the zone of spectral sensitivity of the photovoltaic cell alone, and a series of thin luminescent layers of different compositions applied on said photocell, the order of succession and the composition of the individual thin layers being selected in such a manner that the light energy in a spectrum zone of this light, falling on the outermost thin layer, is transferred successively in cascade, through the intermediary of the various layers interposed, up to the spectral sensitivity zone of said photovoltaic cell.

8. A photovoltaic device as claimed in claim 7, wherein the thin layers are transparent for the light in the sensitivity spectrum of the photovoltaic cell.

9. A photovoltaic device as claimed in claim 7, comprising in addition an anti-reflecting layer on top of said thin layers.

10. A photovoltaic device as claimed in claim 7, the successive layers are made of substances having luminescence properties, which are cyclic derivatives of aromatic elements.

* * * * *